(12) United States Patent
Puma

(10) Patent No.: US 7,427,903 B2
(45) Date of Patent: Sep. 23, 2008

(54) POLAR MODULATOR AND A USE THEREOF

(75) Inventor: Giuseppe Li Puma, Bochum (DE)

(73) Assignee: Infineon Technologies AG, Munich (DE)

( * ) Notice: Subject to any disclaimer, the term of this patent is extended or adjusted under 35 U.S.C. 154(b) by 66 days.

(21) Appl. No.: 11/284,514

(22) Filed: Nov. 22, 2005

(65) Prior Publication Data

US 2006/0135089 A1 Jun. 22, 2006

(30) Foreign Application Priority Data

Nov. 24, 2004 (DE) .................. 10 2004 056 765

(51) Int. Cl.
*H03C 3/38* (2006.01)
(52) U.S. Cl. .................. 332/145; 332/106; 332/108; 332/128; 455/102; 455/108
(58) Field of Classification Search .............. 332/106, 332/145, 108, 128; 455/102, 108
See application file for complete search history.

(56) References Cited

U.S. PATENT DOCUMENTS

| 6,194,963 | B1 * | 2/2001 | Camp, Jr. et al. ............ 330/149 |
| 6,650,875 | B1 * | 11/2003 | Rozenblit et al. ............. 455/94 |
| 6,701,134 | B1 * | 3/2004 | Epperson .................... 455/102 |
| 6,985,703 | B2 * | 1/2006 | Groe et al. .................. 455/108 |
| 2003/0134611 | A1 * | 7/2003 | Park et al. ................... 455/265 |

FOREIGN PATENT DOCUMENTS

DE 195 35 075 A1 4/1996
DE 100 45 761 A1 3/2002

OTHER PUBLICATIONS

"Techniques for High Data Rate Modulation and Low Power Operation of Functional-N Frequency Synthesizers", Michael Henderson Perrot, Thesis Doctor of Philosophy in Electrical Engineering and Computer Science, Sep. 1997, Massachusetts Institute of Technology, 13 pgs.
"RF Microelectronics", Behzad Razavi, Prentice Hall Communications Engineering and Emerging Technologies Series, Chap. 3.3.3, 12 pgs.

* cited by examiner

*Primary Examiner*—Robert J. Pascal
*Assistant Examiner*—Levi Gannon
(74) *Attorney, Agent, or Firm*—Eschweiler & Associates, LLC

(57) ABSTRACT

A polar modulator has a low AM-AM and AM-PM distortion comprises a phase locked loop. The phase locked loop is designed for outputting a high-frequency signal with a frequency derived from a phase modulation signal at an actuating input of the phase locked loop. A filter device, for suppressing a DC signal component, is coupled to an output of the phase locked loop. Furthermore, provision is made of a controllable voltage source with a control input suitable for feeding in an amplitude modulation signal. A push-pull amplifier is connected by an input to the filter device. It comprises two feedback amplifier transistors connected in series, which are connected to a voltage output of the controllable voltage source for supply purposes. Control terminals of the amplifier transistors are connected to the input and, via a load, to an output of the push-pull amplifier.

17 Claims, 4 Drawing Sheets

POLAR MODULATOR AND A USE THEREOF

REFERENCE TO RELATED APPLICATIONS

This application claims the benefit of the priority date of German application DE 10 2004 056 765.4, filed on Nov. 24, 2004, the contents of which are herein incorporated by reference in their entirety.

FIELD OF THE INVENTION

The invention relates to a polar modulator and to a use of the polar modulator.

BACKGROUND OF THE INVENTION

In modern communication systems, the information items to be transmitted are usually coded both in terms of the phase and in terms of the amplitude of a signal. As a result, it is possible to achieve significantly greater data transmission rates than in the case of conventional types of modulation which use pure amplitude or phase modulation, respectively. Examples of such types of modulation are the PSK modulations (Phase Shift Keying) such as a π/4-DQPSK, 8-DPSK or 8-PSK modulation, but also a Quadrature Amplitude Modulation (QAM). They are referred to as digital modulation types, in contrast to analog amplitude or frequency modulation.

FIG. 6 shows a constellation diagram for an 8-PSK modulation. In this case, the x axis represents the first, real component I and the y axis represents the second, quadrature component Q. The information to be transmitted is coded by a value pair i, q, depending on its content in one of the points represented. A value pair i, q is referred to as a symbol. In the example illustrated, one symbol codes a total data content of 3 bits in the case of an 8-PSK modulation. It is evident that the amplitude of the i and q values changes over time, depending on the data content to be coded. Therefore, an 8-PSK modulation is referred to as a modulation type exhibiting non-constant envelope modulation. The 8-PSK modulation is used for example for the GSM/EDGE mobile radio standard.

In addition to representing a symbol by means of a value pair i, q, it is possible to specify the symbol in terms of its phase φ and its amplitude r. The two representations in I/Q notation and rφ notation are synonymous.

Accordingly, in addition to I/Q modulators, polar modulators can also be used for the transmission of modulated signals. While I/Q modulators process I and Q signals for a modulation, polar modulators modulate the phase and the amplitude. The functioning for an I/Q modulator is described in Behzad Razavi, "RF Micro-electronics", Chapter 3.3.3.

One example of a known polar modulator is shown in FIG. 5. The information items to be transmitted are present as digital data $a_k$ and are conditioned in a coder circuit and a further circuit. The digital data are then converted into their phase value φ(k) and also into an amplitude value r(k) in the circuit 900. The phase information φ(k) is fed to a phase locked loop PLL. It is used to modulate the output signal of the phase locked loop PLL in accordance with the phase-coded information. A phase-modulated output signal φ(t) is thus present at the output of the control loop PLL. At the same time, the amplitude information r(k) is fed to a digital-to-analog converter DAC which converts the amplitude information r(k) present in digital fashion into a temporal analog signal. The analog amplitude modulation signal r(t) is fed to a mixer via a low-pass filter. The phase-modulated signal is combined with the amplitude modulation signal in said mixer.

The requirements made of the final mixer stage are problematic in the case of this solution. Said mixer stage should have a sufficiently high linear transfer response in order to comply with the large amplitude range required in many mobile radio standards.

In the case of a nonlinear transfer response of the mixer, amplitude or phase distortions dependent on the amplitude modulation signal r(t) may occur. Such distortions are referred to as AM/AM or AM/PM distortions. The distortion generates data errors and the frequency spectrum of the signal that is output changes.

FIG. 4 shows the frequency spectrum as a function of an amplitude/phase distortion. It is evident that even a slight frequency offset of 1°/dB infringes the spectral mask of the GSM/EDGE mobile radio standard as illustrated in FIG. 4. It is therefore necessary to minimize distortions.

The embodiment of a polar modulator that is known in FIG. 5 leads to a high space requirement for the mixer when account is taken of the requirements made of a very linear response. Moreover, such a polar modulator cannot be implemented in novel CMOS technologies with low supply voltages in the range of 1.5 V to 2.5 V, since linearity is not ensured there.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one or more aspects or arrangements of the invention, a polar modulator suitable for low supply voltages and which can be realized in space-saving fashion, in one example as an integrated circuit in a semiconductor body is provided.

In accordance with one aspect, a polar modulator has a first signal input, a second signal input and a phase locked loop. The phase locked loop contains a reference input for feeding in a reference signal and also an actuating input coupled to the first signal input. The control loop is designed for outputting a high-frequency signal with a frequency derived from a signal at the first signal input and thus at the actuating input of the phase locked loop. A filter device is coupled to an output of the phase locked loop for the purpose of suppressing a DC signal component. Furthermore, provision is made of a controllable voltage source, the control input of which is coupled to the second signal input of the polar modulator according to the invention. A push-pull amplifier is connected by an input to the filter device. The push-pull amplifier comprises two feedback amplifier transistors connected in series, which are connected to a voltage output of the controllable voltage source for supply purposes. The control terminals of the two amplifier transistors are connected to the input of the push-pull amplifier and, via a load, to an output of the push-pull amplifier for feedback purposes.

In accordance with another aspect, a polar modulator is thus realized which generates a very lbw amplitude and phase distortion with its push-pull amplifier connected on the output side. According to the invention, in contrast to conventional concepts, an amplitude modulation is generated by a modulation of the supply voltage on the push-pull amplifier. A mixer of complicated configuration can thus be dispensed with. Moreover, the push-pull amplifier according to the invention operates very efficiently in respect of power and can be operated as an approximately perfect switch.

The polar modulator according to the invention, in one example, is suitable for an integration and, in particular, for a design as an integrated circuit in a semiconductor body using CMOS technology. The push-pull amplifier operating as a switch achieves a large dynamic range, the signal/noise ratio being significantly improved at the same time. Accordingly, a supply voltage can also, in one example, be reduced. The feedback of the control terminals via the load with the output of the push-pull amplifier according to the invention increases the linearity and reduces distortions. The filter device makes it possible to realize suppression of the DC signal component and thus to prevent a "flow" of a DC signal current into the phase modulation path.

In one example, an amplifier circuit having a limiting amplifying behavior is provided between the output of the phase locked loop and the filter device. The push-pull amplifier is, operated with an amplitude-limited signal with sharply falling and rising edges. This improves the switching behavior of the push-pull amplifier.

In another aspect, a digital/analog converter is connected upstream of the control input of the voltage source, the input of said digital/analog converter being connected to the second signal input for feeding in a digital amplitude modulation signal. In one example, both an analog amplitude modulation signal and a digital amplitude modulation signal can thus be used in the amplitude modulation path. The same serves for setting the output voltage of the controllable voltage source, which is in turn connected to the supply terminal of the push-pull amplifier in the polar modulator according to the invention. The modulation of the supply voltage enables a significantly higher dynamic range of the output signal.

A multiplication unit is connected upstream of the control input of the voltage source. Said multiplication unit is designed for scaling the amplitude modulation signal at a first input of the multiplication unit with a scaling factor. The scaling factor is fed to a second input of the multiplication unit. The embodiment of a multiplication unit achieves a scaling with regard to an output amplitude of the output signal. As a result, the dynamic range of the signal can be increased without generating additional amplitude or phase distortions.

In another development of the invention, the phase locked loop comprises a frequency divider in a feedback path. The frequency divider is designed to divide the frequency of a signal present on the input side by an adjustable divider factor and feed it to a phase detector of the phase locked loop. The frequency divider ratio is set by means of a signal at the setting input. The frequency divider can in one example, be formed with a sigma-delta ($\Sigma\Delta$) frequency divider.

In one aspect of the invention, the controllable voltage source comprises a feedback differential amplifier and an actuating transistor. The actuating transistor is connected to a supply terminal by one terminal and with the other terminal forms the voltage output of the controllable voltage source. A first input of the differential amplifier forms the control input and a second input of the differential amplifier is connected to the output of the voltage source. An output of the differential amplifier is coupled to the control terminal of the actuating transistor.

In one example, a low-pass filter for suppressing high-frequency components is connected between the voltage output of the controllable voltage source and a supply terminal of the push-pull amplifier.

The polar modulator according to the invention can in one example, be used for the modulation of signals with a type of modulation which codes information items both in terms of the phase and in terms of the amplitude. These are types of modulation in the case of which the envelope of the output signal is not constant in terms of its amplitude.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below on the basis of exemplary embodiments with the aid of the drawings.

DETAILED DESCRIPTION OF THE INVENTION

Figure 1:
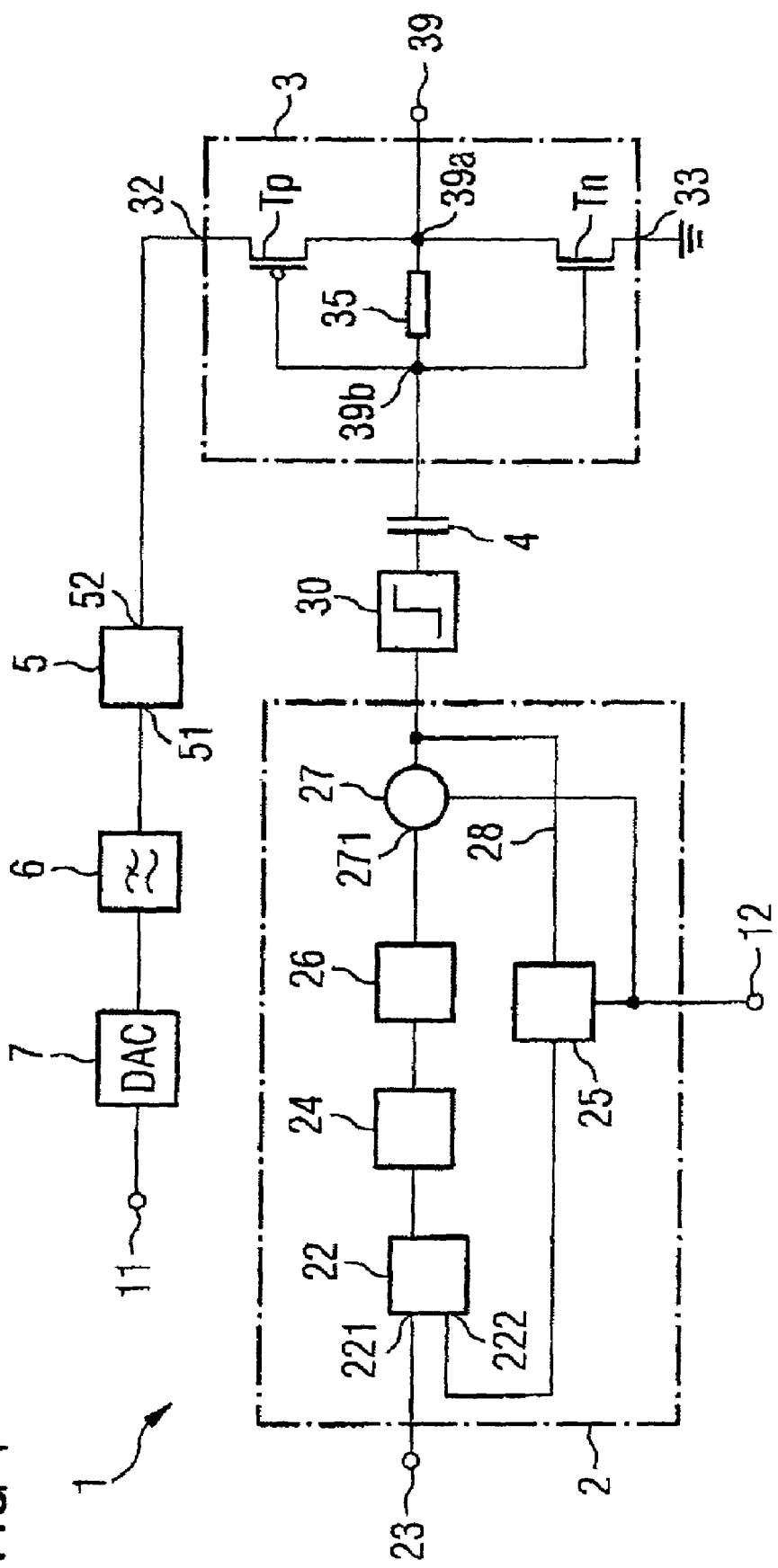
FIG. 1 shows a first exemplary embodiment of the polar modulator.

The present invention will now be described with reference to the attached drawings, wherein like reference numerals are used to refer to like elements throughout. It will be appreciated by those skilled in the art that the invention is not limited to the example implementations and aspects illustrated and described hereinafter.

FIG. 1 shows the polar modulator according to the invention in a first configurational form. Said polar modulator is formed as an integrated circuit in a semiconductor body. In particular, the integrated circuit is embodied using CMOS technology. Suitable semiconductor materials include silicon, gallium arsenide (GaAs), silicon germanium (SiGe) or other semiconductor compounds. The semiconductor materials permit a space-saving design of the polar modulator in conjunction with low supply voltages and supply currents. Mobile communication applications with a limited energy reserve can thus be operated for longer.

The polar modulator according to the invention has a first signal input 11, a second signal input 12 and also a reference input 23 and a signal output 39. An amplitude modulation signal is present at the signal input 11. Said signal serves for modulating an output signal in terms of its amplitude. The second signal input 12 can be fed a phase modulation signal for modulating the phase of the output signal. The modulated high-frequency signal can be tapped off at the signal output 39 during operation of the polar modulator according to the invention. The polar modulator comprises a phase locked loop 2 containing a feedback path 28.

The phase locked loop 2 has, in detail, a phase detector 22 with a first input 221 and a second input 222. The first input 221 forms the reference input and is connected to the input 23. The second input 222 forms the feedback input. The phase detector 22 is designed for comparing the phase of signals present at the inputs 221 and 222, respectively. Depending on the phase difference, said phase detector generates an actuating signal at its output, which actuating signal is fed to a charge pump 24. An output of the charge pump 24 is connected via a loop filter 26 to an actuating input 271 of a voltage controlled oscillator 27. Depending on an actuating signal at the actuating input, the voltage controlled oscillator 27 generates a high-frequency output signal at its output. Said high-frequency output signal is output at the output of the phase locked loop.

The output of the oscillator is connected to a frequency divider 25 via a feedback path 28 in order to form the control loop. The frequency divider 25 is formed as a multi-modulus divider with an adjustable divider ratio. It divides the frequency of a signal present on the input side by an adjustable divider ratio and outputs a signal with the correspondingly divided frequency at its output. The output of the frequency divider 25 is connected to the feedback input 222 of the phase detector 22. In this configurational form, the frequency divider 25 has a multiplicity of adjustable divider ratios. In particular, fractional divider ratios can also be set by means of the frequency divider 25. For this purpose, the frequency divider contains a sigma-delta frequency divider. The frequency divider ratio is fed as a digital signal to an actuating input 12. Moreover, the frequency divider ratio is simultaneously also fed as an analog control signal to the voltage controlled oscillator 27 at a control input. A change in the frequency divider ratio leads, through the phase detector 22, to a change in the actuating signal at the actuating input 271 of the voltage controlled oscillator.

The output of the phase locked loop 2 is connected to a limiting amplifier 30. The latter generates from the output signal a rectangular-waveform pulse signal with steeply rising and falling edges. On the output side, the limiting amplifier 30 is connected to a filter device 4 for suppressing DC signal components. In the exemplary embodiment, the filter device 4 is formed as a simple capacitor. The limiting frequency of the filter device can be set depending on the capacitance of said capacitor.

The phase locked loop forms, together with the filter device and the limiting amplifier 30, the phase modulation path of the polar modulator according to the invention. An amplitude modulation path is furthermore provided. Said amplitude modulation path comprises a digital/analog converter 7, which is connected to the first signal input on the input side. On the output side, the digital/analog converter 7 is connected to a control input 51 of a controllable voltage source 5 via a low-pass filter 6. The controllable voltage source 5 generates at its output 52 a voltage that is dependent on a control signal at the control input 51.

The voltage output 52 of the controllable voltage source 5 is connected to a supply input 32 of a push-pull amplifier 3. The push-pull amplifier 3 contains two transistors Tp and Tn connected in series. The two transistors Tp and Tn are formed as field effect transistors having different conductivity types. The p-channel field effect transistor Tp forms the supply terminal 32 with one terminal. The second terminal is connected via a node 39a to a resistor 35 and to the n-channel field effect transistor Tn. A second terminal of the transistor Tn forms the second supply terminal 33 and is connected to the ground potential. Control terminals of the two transistors Tp and Tn are combined at a node 39b and connected both to the filter device and to the resistor 35. Accordingly, the resistor 35 is connected between the output and the input of the push-pull amplifier and thus forms a feedback. The feedback leads to a linearization and reduces an amplitude or phase distortion.

For the modulation of a signal, the phase or frequency information is fed in the form of an actuating signal at the setting input 12 of the frequency divider 25. The output signal of the voltage controlled oscillator is thus frequency- or phase-modulated. In addition, the oscillator likewise changes its frequency owing to the control signal that is fed in. For this purpose, the control signal derived from the actuating signal at the actuating input 12 is conditioned in a suitable manner. The control signal serves for changing the frequency of the oscillator in the direction in which a change is also effected by the actuating signal. The frequency setting of the oscillator 27 with the control signal and the actuating signal at the input 271 is particularly efficient and rapid and is referred to as 2-point modulation. The phase locked loop forms a 2-point modulator and generates a phase or frequency modulation of the signal that is output.

The output signal of the phase locked loop 2 is amplified and applied to the input of the push-pull amplifier 3 via the filter device 4. The amplification of the frequency- or phase-modulated signal is set by way of the supply voltage of the push-pull amplifier 3. The supply voltage remains constant in the case of a pure phase or frequency modulation.

For higher-level types of modulation which code information items both in terms of the phase and in terms of the amplitude, the supply voltage is changed in accordance with the amplitude modulation signal at the input 11. For this purpose, the amplitude modulation signal is fed as a digital signal to the input 11. The digital/analog converter 7 generates from this an analog modulation signal and feeds the latter via the low-pass filter 6 to the control input 51 of the voltage source 5. The low-pass filter 6 suppresses higher-level frequency components that are generated during the digital/analog conversion. The controllable voltage source 5 modulates the supply voltage of the push-pull amplifier 3 and of the two transistors Tp and Tn in accordance with the signal at the control input. Through the direct modulation of the supply voltage, the envelope of the frequency- or phase-modulated signal is altered in terms of its amplitude. The push-pull amplifier enables an amplitude modulation of approximately 100%.

By increasing the supply voltage, it is possible to increase the dynamic range of the output signal. For mobile radio standards which operate according to a time slot method, for example GSM or Bluetooth, the modulation of the supply voltage furthermore permits a "power ramping" function, that is to say the rising or falling at the start or at the end, respectively, of a signal to be transmitted.

The feedback resistor 35 in one example, has a high resistance and ensures that the switching point of the push-pull amplifier lies at the operating point.

Figure 2:
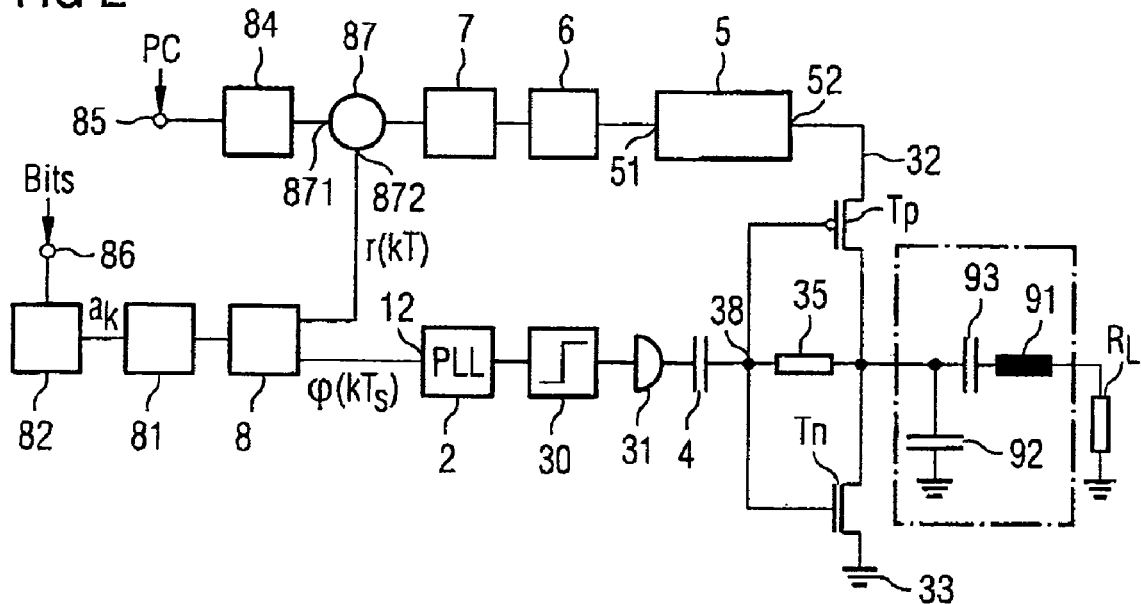
FIG. 2 shows a second exemplary embodiment.

FIG. 2 shows a development of the invention. Components that are identical in terms of their effect or functioning bear the same reference symbols. The embodiment illustrated in FIG. 2 shows a transmission path with the polar modulator according to the invention. In this case, the amplitude or phase modulation signal is generated by a converter circuit 8. The latter is connected to a pulse shaping filter 81 on the input side, which pulse shaping filter is connected to a coder 82. The data to be transmitted are fed in the form of bit data to the input 86, which is connected to the input of the coder 82. The latter combines the bit data to be transmitted in accordance with a predetermined modulation to form symbols. For an 8-PSK modulation, 3 bits in each case are combined to form one symbol. The symbol is characterized by a phase $\Phi$ and an amplitude R. In particular, a symbol $a_k$ can be represented by $$a_k = r(k) * e(j\Phi(k))$$

The symbol $a_k$ is transferred in digital form to the coding circuit 8. It generates from this a temporally dependent phase modulation signal $\Phi(k T_S)$, which is fed to the actuating input 12 of the phase locked loop 2. In parallel with this, the circuit 8 outputs the amplitude modulation signal r(k $T_S$). In this case, care is taken to ensure that the phase and amplitude modulation signals are synchronous, that is to say are present simultaneously in the later signal processing, in particular in the push-pull amplifier 3. This ensures that the amplitude and phase information of a symbol to be transmitted is always processed simultaneously in the push-pull amplifier.

The output of the coding circuit 8 for the amplitude information r(k $T_S$) is connected to a multiplication unit 87. A second input of the multiplication unit 87 is connected to a power control unit 84. The power control unit 84 is designed for feeding in a power control signal PC on the input side. The output of the multiplication unit 87 is connected to the digital/analog converter 7. The low-pass filter connected downstream has a limiting frequency tuned to the amplitude information to be transmitted. In this case, the limiting frequency may be dependent on the oversampling rate of the analog/digital converter. At a clock rate of 270 kHz for the digital amplitude signal r(k $T_S$), the limiting frequency is 1.5 MHz in one form of realization.

The multiplication unit 87 serves for scaling the amplitude of the output signal in a manner dependent on a desired output power. The scaling is predetermined by the power control signal PC. The power control unit 84 generates from this the scaling factor with which the amplitude modulation signal r(k $T_S$) is scaled.

On the output side, the push-pull amplifier and the node 39a are connected to a matching network comprising two capacitors 92 and 93 and a coil 91. The matching network serves for transforming the impedance to the impedance of a load RL connected at the output. The two amplifiers 30 and 31 improve the signal quality and generate steep rising and falling edges of the phase-modulated signal. The filter device 4 with the capacitor connected into the signal path suppresses a DC signal component, in particular a DC voltage that might pass from the push-pull amplifier into the output of the amplifier 31 or 32. This improves the linearity and the output behavior of the amplifiers 30 and 31 in the phase modulation path of the polar modulator.

Figure 3:
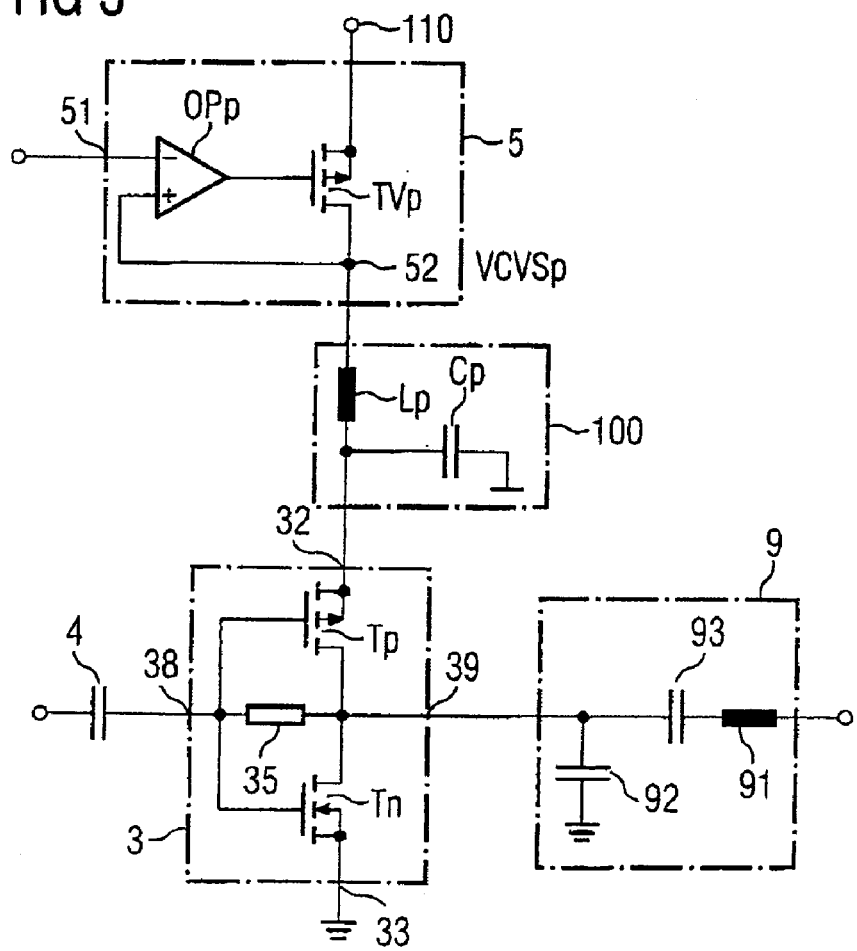
FIG. 3 shows an excerpt with an exemplary embodiment of the controllable voltage source.
Figure 4:
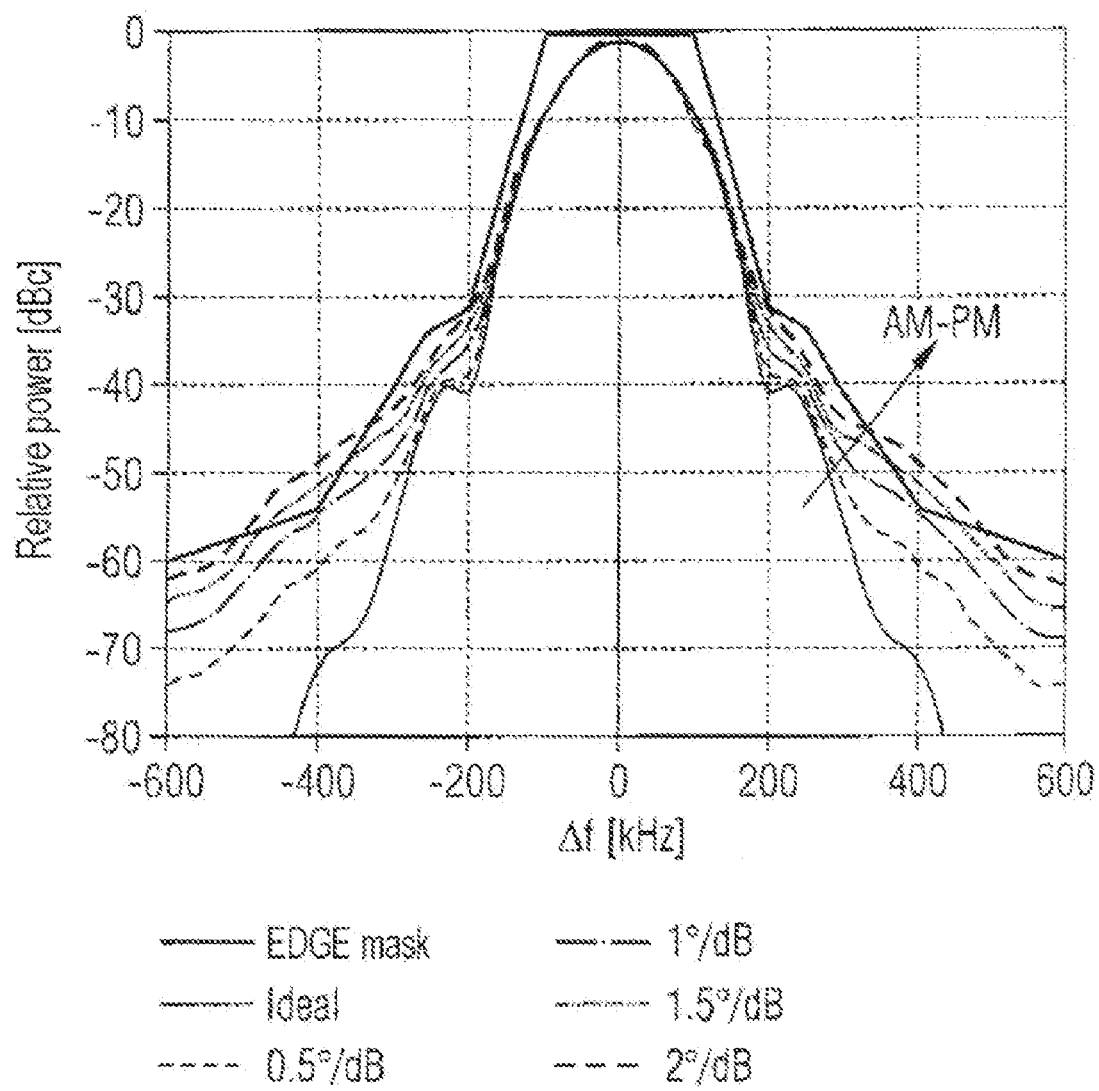
FIG. 4 shows various frequency spectra for illustrating the influence of an amplitude and phase distortion.
Figure 5:
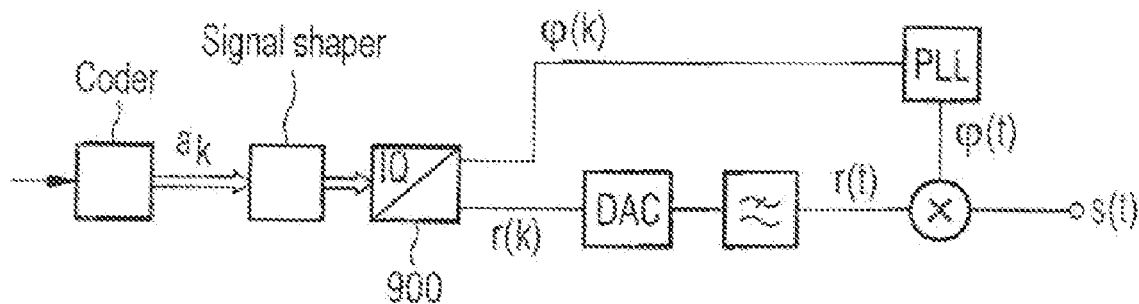
FIG. 5 shows a known polar modulator.
Figure 6:
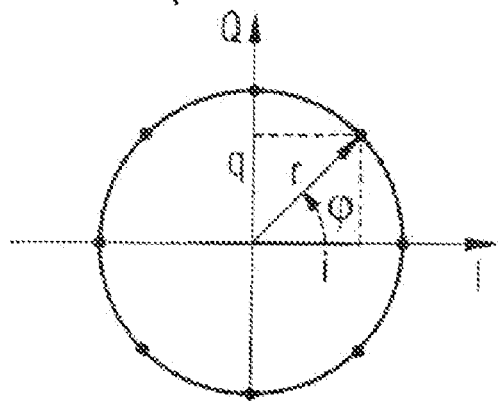
FIG. 6 shows a constellation diagram.

FIG. 3 shows an excerpt from the polar modulator according to the invention with an exemplary embodiment of the controllable voltage source 5 and also the push-pull amplifier 3. Components that are identical in terms of their effect and functioning bear the same reference symbols here, too. A low-pass filter 100 is connected between the supply terminal 32 of the push-pull amplifier 3 and the control output 52 of the controllable voltage source 5. Said low-pass filter contains a series-connected coil Lp and also a capacitor Cp arranged in parallel therewith. The low-pass filter 100 suppresses high-frequency components of the supply voltage which may lead to distortions in the output signal of the push-pull amplifier 3. The limiting frequency is to be set in a suitable manner. By way of example, the symbol rate is 270 kSym/s for the GSM/EDGE mobile radio standard. The limiting frequency should therefore be greater than 270 kHz, for example 450 kHz. At this limiting frequency, harmonic components are suppressed to a sufficiently great extent.

The controllable voltage source 5 contains an actuating transistor TVp. The actuating transistor is formed as a field effect transistor with a p-channel conductivity type. One terminal of the actuating transistor TVp leads to a supply terminal 110 for feeding in a supply potential VDD. The second terminal forms the control output 52 of the voltage source 5. The actuating terminal of the transistor TVp is connected to the output of a differential amplifier OPp. The latter is connected by its noninverting input "+" to the control output 52 of the voltage source 5. The inverting input "−" of the differential amplifier OPp forms the control input 51 for feeding in the analog voltage control signal. Depending on a control signal at the control input 51, the differential amplifier OPp generates a differential signal and thus controls the conductivity or the voltage drop across the actuating transistor TVp.

The polar modulator according to the invention, by virtue of its direct modulation of a supply voltage of a push-pull amplifier on the output side, can be used both for pure phase or frequency modulations such as GFSK, for example, but also for mixed modulation types which alter the amplitude. These include not only the phase modulations BPSK but also the quadrature amplitude modulation QAM. In this case, it must be taken into account that an amplitude modulation of the supply voltage is effected synchronously with phase modulation. This ensures that phase and amplitude information of a symbol to be transmitted is processed simultaneously in the push-pull amplifier. In the case of a pure phase or frequency modulation, a gain factor at the output stage can be set by means of a DC signal and the scaling factor. The polar modulator according to the invention generates only low AM-AM and AM-PM distortions depending on a supply voltage in the range of 0.5 V to 2.5 V.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

LIST OF REFERENCE SYMBOLS

1: Polar modulator
2: Phase locked loop
3: Push-pull amplifier
4: Filter device
5: Controllable voltage source
6: Low-pass filter
7: Digital/analog converter
8: Coding circuit
9: Matching network
11: Amplitude modulation signal input
12: Phase modulation signal input
23: Reference input
22: Phase detector
24: Charge pump
26: Loop filter 27: Voltage controlled oscillator
30: Limiting amplifier
32, 33 Supply terminal
35: Resistor
38: Amplifier input
39: Amplifier output
39a, 39b: Node
51: Control input
52: Voltage output
84: Power control unit
85: Power control signal input
87: Multiplication unit
92, 93: Capacitor
91: Coil
110: Supply terminal
Tp, Tn: Amplifier transistor
TVp: Actuating transistor
OPp Differential amplifier
100: Low-pass filter

What is claimed is:

1. A polar modulator comprising:
a first signal input that receives a phase modulation signal;
a second signal input that receives an amplitude modulation signal;
a phase locked loop with a reference input that receives a reference signal, an actuating input coupled to the first signal input, and an output, wherein the phase locked loop outputs a high-frequency signal with a frequency derived from the reference signal and the phase modulation signal at the output;
a controllable voltage source with a voltage output and a control input coupled to the second signal input;
a filter device having an input and an output, that receives the high-frequency signal at the input;
a push-pull amplifier operating in a switching mode with an output and an input coupled to the filter device and a load which is coupled to the output, wherein the push-pull amplifier has two amplifier transistors connected in series and connected to the voltage output of the controllable voltage source and control terminals of the two amplifier transistors are connected to the input; and
an amplifier circuit having a limiting amplifying behavior coupled to the output of the phase locked loop and the input of the filter device.

2. The polar modulator of claim 1, further comprising a digital/analog converter upstream of the control input of the controllable voltage source and having an input of the digital/analog converter receive a digital amplitude modulation signal.

3. The polar modulator of claim 2, further comprising a low pass filter connected between the digital analog converter and the controllable voltage source.

4. The polar modulator of claim 3, further comprising a multiplication unit connected upstream of the control input of the controllable voltage source, wherein the multiplication unit scales the digital amplitude modulation signal with a scaling factor.

5. The polar modulator of claim 1, wherein the phase locked loop further comprises a feedback path comprising a frequency divider that divides the high frequency signal by a divider factor.

6. The polar modulator of claim 5, wherein the frequency divider is formed with a sigma-delta frequency divider.

7. The polar modulator of claim 1, wherein the phase locked loop is formed with a 2-point modulator.

8. The polar modulator of claim 1, wherein the filter device comprises a capacitor.

9. The polar modulator of claim 1, wherein the controllable voltage source comprises a feedback differential amplifier and an actuating transistor, connected to a supply terminal, wherein a first input of the feedback differential amplifier is the control input and a second input is the voltage output and is connected to a control terminal of the actuating transistor.

10. The polar modulator of claim 1, further comprising a low pass filter connected between the voltage output of the controllable voltage source and a supply terminal of the push-pull amplifier.

11. The polar modulator of claim 1, wherein the two amplifier transistors of the push-pull amplifier have different conductivity types.

12. The polar modulator of claim 1, wherein the polar modulator is operated as a transmitting device for radio signals in which both a phase or frequency of the radio signal and an amplitude of the radio signal are modulated.

13. The polar modulator of claim 1, wherein the filter device suppresses DC components of the high-frequency signal.

14. A polar modulator comprising:
a first signal input that receives a phase modulation signal;
a second signal input that receives an amplitude modulation signal;
a phase locked loop with a reference input that receives a reference signal, an actuating input coupled to the first signal input, and an output, wherein the phase locked loop outputs a high-frequency signal with a frequency derived from the reference signal and the phase modulation signal at the output;
a controllable voltage source with a voltage output and a control input coupled to the second signal input;
a filter device having an input and an output, that receives the high-frequency signal at the input; and
a push-pull amplifier operating in a switching mode with an output and an input coupled to the filter device and a load which is coupled to the output, wherein the push-pull amplifier has two amplifier transistors connected in series and connected to the voltage output of the controllable voltage source and control terminals of the two amplifier transistors are connected to the input, wherein the load of the push-pull amplifier comprises a resistor.

15. A polar modulator comprising:
a phase locked loop having a reference input that receives a reference signal, an actuating input that receives a phase modulation signal, and generates a high-frequency signal at its output with a frequency derived from the reference signal and the phase modulation signal;
a controllable voltage source that receives an amplitude modulation signal and generates a voltage control signal according to the amplitude modulation signal; and
a push-pull amplifier operating in a switching mode that receives the high-frequency signal from the phase locked loop, employs the voltage control signal as a supply voltage, and generates a modulated high-frequency signal, wherein the push-pull amplifier comprises a first supply terminal that receives the voltage control signal, a second supply terminal connected to ground, an input that receives the high-frequency signal, and an output that provides the modulated high-frequency signal.

16. The polar modulator of claim 15, wherein the push-pull amplifier further comprises a p-type transistor having a first terminal coupled to the first supply input, a control gate coupled to the input, and a second terminal coupled to the output, an n-type transistor having a first terminal coupled to the second terminal of the p-type transistor, a control gate coupled to the input, and a second terminal coupled to a base voltage, and a load having a first terminal coupled to the input and a second terminal coupled to the second terminal of the p-type transistor.

17. The polar modulator of claim 15, further comprising a digital/analog converter that converts a digital amplitude modulation signal into an analog signal and a low pass filter that filters the analog signal and provides the amplitude modulation signal to the controllable voltage source.

* * * * *